US007562322B2

(12) United States Patent
Lu

(10) Patent No.: US 7,562,322 B2
(45) Date of Patent: Jul. 14, 2009

(54) DESIGN VERIFICATION FOR A SWITCHING NETWORK LOGIC USING FORMAL TECHNIQUES

(75) Inventor: Yuan Lu, San Jose, CA (US)

(73) Assignee: Broadcom Corporation, Irvine, CA (US)

( * ) Notice: Subject to any disclaimer, the term of this patent is extended or adjusted under 35 U.S.C. 154(b) by 128 days.

(21) Appl. No.: 11/735,808

(22) Filed: Apr. 16, 2007

(65) Prior Publication Data

US 2007/0186197 A1    Aug. 9, 2007

Related U.S. Application Data

(62) Division of application No. 10/835,561, filed on Apr. 29, 2004, now abandoned.

(60) Provisional application No. 60/563,205, filed on Apr. 17, 2004, provisional application No. 60/524,365, filed on Nov. 21, 2003.

(51) Int. Cl.
  *G06F 17/50* (2006.01)
(52) U.S. Cl. ............... 716/4; 716/1; 716/2; 716/3; 716/5; 716/18; 703/13; 703/14
(58) Field of Classification Search .............. 716/1–5, 716/18; 703/13, 14
See application file for complete search history.

(56) References Cited

U.S. PATENT DOCUMENTS

| 5,999,717 | A |   | 12/1999 | Kaufmann et al. |
| 6,080,203 | A | * | 6/2000  | Njinda et al. ............... 716/4 |
| 6,141,633 | A |   | 10/2000 | Iwashita et al. |
| 6,311,293 | B1 |  | 10/2001 | Kurshan et al. |
| 6,324,496 | B1 | * | 11/2001 | Alur et al. ................. 703/17 |
| 6,708,143 | B1 |  | 3/2004  | Kurshan |
| 6,728,939 | B2 | * | 4/2004  | Johannsen ................. 716/5 |
| 2001/0050912 | A1 | * | 12/2001 | Malalur et al. ............. 370/357 |
| 2003/0225552 | A1 |  | 12/2003 | Ganai et al. |
| 2004/0006451 | A1 |  | 1/2004  | Bharadwaj et al. |
| 2004/0093571 | A1 |  | 5/2004  | Jain et al. |
| 2004/0210860 | A1 |  | 10/2004 | Ganai et al. |

OTHER PUBLICATIONS

Bentley, B., "Validating the Intel Pentium 4 Microprocessor." Intel Corporation, 6 pages, 2001.
Clarke, Jr. et al., "Model Checking," The MIT Press, 1991, 314 pages.
Communication from the European Patent Office dated Apr. 15, 2005; European Search Report, Application No. Application No. EP 04 02 6607, Search Completed on Mar. 24, 2005, Munich.
Lu, Yuan et al. "Verifying a Gigabit Ethernet Switch Using SMV." Design Automation Conference. 2004. Proceedings, 41st San Diego, CA USA, Jun. 7-11, 2004, Piscataway, NJ, USA, IEEE, Jun. 7, 2004, pp. 230-233. ISBN: 1-51183-828.
Lu, Yuan et al. "Tutorial 6. A Semi-Formal Verification Methodology." ASIC 2001, Proceedings. 4th International Conference on Oct. 23-25, 2001, Piscataway, NJ, USA, IEEE, Oct. 23, 2001 pp. 33-37. ISBN: 0-7803-6677-8.

(Continued)

*Primary Examiner*—Vuthe Siek
*Assistant Examiner*—Nghia M Doan

(57) ABSTRACT

Formal techniques are applied to industrial design problems such as verification of a circuit design. Initial decisions may include defining properties to verify the design. An abstraction of the design may be generated and model checking applied to the abstraction. Results obtained using these techniques may be extended by performance analysis and/or verification of sequential operations.

17 Claims, 7 Drawing Sheets

OTHER PUBLICATIONS

Burch, J.R. et al. "Symbolic Model Checking for Sequential Circuit Verification." IEE Transactions on Computer Aided Design of Integrated Circuits and Systems. IEEE, New York, US, vol. 13, No. 4, Apr. 1, 1994, pp. 401-424. ISSN: 0278-0070.

Clarke, E.M. et al. "Model Checking and Abstraction." ACM Transactions on Programming Languages and Systems, USA, vol. 16 No. 5, Sep. 1994, pp. 1512-1542. ISSN: 0164-0925.

McMillan, K.L. "Verification of Infinite State Systems by Compositions Model Checking" Correct Hardware Design Verification Methods. 10th IFIP WG10.5 Advanced Research Working Conference, Charme '99. Proceedings (Lecture Notes in Computer Science vol. 1703) Springer-Verlag Berlin, Germany, 1999, pp. 219-237. ISBN: 3-540-66559-5.

* cited by examiner

DESIGN VERIFICATION FOR A SWITCHING NETWORK LOGIC USING FORMAL TECHNIQUES

CROSS REFERENCE RELATED TO APPLICATION(S)

This application is a divisional of U.S. patent application Ser. No. 10/835,561 filed on Apr. 29, 2004, which claims the benefit of U.S. Provisional Application 60/563,205, filed Apr. 17, 2004, and U.S. Provisional Application 60/524,365 filed Nov. 21, 2003, the disclosures of all which are hereby incorporated by reference.

FIELD OF THE INVENTION

This application relates to design verification and, more specifically, to formal analysis verification techniques.

BACKGROUND

Verification of a circuit design typically involves testing the circuit design before the design is physically implemented as a circuit (e.g., fabricated as an integrated circuit). In this way, errors (i.e. "bugs") in the design may be identified before the designer incurs the expense of fabrication.

As circuit designs have become increasingly complex, the task of creating efficient and effective verification tools has become increasing difficult. For example, conventional system-on-chip designs may include relatively large, fast and complex integrated memories, on-chip buses, and sophisticated arbiters. Moreover, these designs typically involve concurrent processes many of which may be interdependent.

Stimulation-based tools have traditionally been used to verify designs. These tools typically verify a design by randomly applying tests to portions of the design. However, simulation-based validation methodologies often fail to discover corner-case design errors. An example of a corner-case error may include an error that does not occur until a specific set of conditions occur at the same time wherein that set of conditions occurs relatively infrequently.

Various formal analysis techniques ("formal techniques") have been proposed for use in verification of circuit designs. The concept behind formal techniques is to thoroughly search the design for errors. Examples of formal techniques include model checking, theorem proving and symbolic simulation.

Applications of formal techniques include verifying a cache coherency protocol using a symbolic model checker and verifying commonly used design structures such as arithmetic circuits, pipelines, bus arbiters and Tomasulo's algorithm. Recently, formal techniques have been applied on a wider range of designs. For example, B. Bentley, *Validating the Intel Pentium 4 microprocessor*, In Design Automation Conference, pages 244-248, 2001, discusses the use of formal techniques to find over 100 "high-quality" logic bugs in the Pentium 4®.

Most formal techniques cannot, however, be applied efficiently to relatively large industrial designs. Some techniques have been proposed to address this problem, including symbolic algorithms, SAT procedures, and abstraction techniques, however, solutions to such problems remain a continuing need.

SUMMARY

Formal techniques are applied to industrial design problems such as verification of a circuit design. These techniques may include, for example, making verification decisions, defining properties to verify a design, creating an abstraction of the design and model checking. In some embodiments, verification may be further extended by performance analysis and/or verification of sequential operations.

In some embodiments, an abstraction (e.g., a reduced model) of the design is generated and this abstraction is used in the model checking process. For example, building on classic model checking, an induction technique may be employed to avoid state explosion as the environment model becomes more sophisticated. As a result, the model checking operation may be performed more efficiently.

In some embodiments, a definition of "high-quality" bugs may be presented and results analyzed with respect to that definition. In this way, the results of the formal techniques may be compared with results from other verification techniques.

In some embodiments, the verification is extended to identify performance margin. Identifying performance margin may include, for example, modifying properties and applying the modified properties to the abstraction to identify timing margins. Such performance analysis may not be achieved by conventional formal or simulation approaches independently.

In some embodiments, the verification is extended to analyze design performance of sequential operations. This analysis may involve, for example, identifying initial and residual states of internal registers to be applied during model checking.

In some embodiments, a symbolic model checker validates circuits such as those found in an integrated circuit (i.e., a "chip"). For example, a symbolic model checker such as Cadence SMV may be used to validate a circuit design with a dynamic nature and great concurrency such as an Ethernet switching logic block in a Gigabit Ethernet networking chip. Here, abstraction may be applied to portions of the switching block to reduce the complexity of the model to be checked. In addition, performance such as switch latency may be verified using the described techniques. In contrast with some conventional techniques, the techniques described herein may be applied to verify designs such as a networking chip that may have fundamentally different verification problems due to, for example, the absence of exact specifications.

Thus, the verification techniques described herein may provide verification results not provided by conventional techniques. For example, the teachings herein may be applied such that an initial decision is that a primary goal is to search the design for errors instead of completely verifying the design. In this way, errors may be identified more quickly as compared to some conventional techniques. Moreover, by using these techniques bugs may be found that might not be found using convention techniques.

BRIEF DESCRIPTION OF THE DRAWINGS

These and other features, aspects and advantages of the present invention will be more fully understood when considered with respect to the following detailed description, appended claims and accompanying drawings, wherein:

Figure 1:
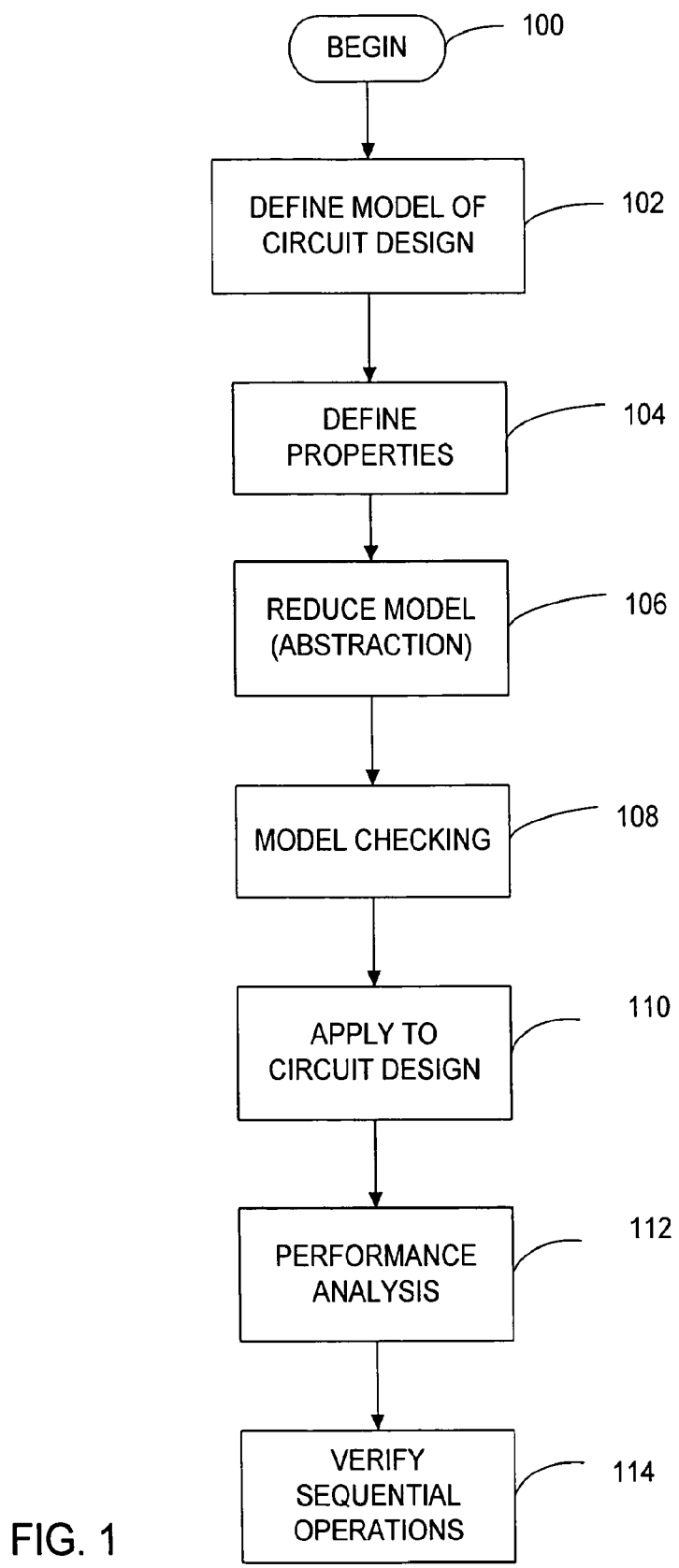
FIG. 1 is a flow chart of one example of verification operations that may be performed in accordance with the invention.

In accordance with common practice the various features illustrated in the drawings may not be drawn to scale. Accordingly, the dimensions of the various features may be arbitrarily expanded or reduced for clarity. In addition, some of the drawings may be simplified for clarity. Thus, the drawings may not depict all of the components of a given apparatus or method. Finally, like reference numerals denote like features throughout the specification and figures.

DETAILED DESCRIPTION

The invention is described below, with reference to detailed illustrative embodiments. It will be apparent that the invention may be embodied in a wide variety of forms, some of which may be quite different from those of the disclosed embodiments. Consequently, the specific structural and functional details disclosed herein are merely representative and do not limit the scope of the invention.

FIG. 1 is a flowchart that represents one embodiment of design verification operations that may be performed in accordance with the invention. In the embodiment of FIG. 1, these operations are applied to a circuit design. For example, a circuit design may be defined using a register-transfer-level ("RTL") tool. It should be appreciated, however, that these operations may be applied to other types of designs.

As represented by block 102, a model of the circuit design is defined. This may involve, for example, identifying features of the design and identifying issues that affect verification decisions. As an example, a given design may consist of various registers, tables and logic operations that need to be characterized to verify the design. In addition, decisions regarding the environment model may be made to increase the efficiency of the verification process. For example, a decision may be made to verify concurrent operations but not verify sequential operations.

Next, as represented by block 104, various properties are defined to verify the design. This process may involve, for example, defining, based on an extensive knowledge of the design, the state of internal registers under various conditions. For example, if the circuit is operating as intended the circuit may be designed such that after a given operation has been performed the values in a register may be limited to a certain values. If the register does not contain the expected values an error condition (and a corresponding "trace") may be generated during model checking.

In some embodiments the properties may be defined by writing a specification of the design using, for example, computational tree logic ("CTL") specification language. In some embodiments, each property may be used to verify a different property of the design. For example, in embodiments where the design is defined in RTL, each property may verify a different RTL function.

In some applications it may be desirable to define properties at a relatively high level. In this way, the properties may not be completely based on the design definition. As a result, the properties may not include the same errors as the design.

In some cases there may not be a complete specification of the design. Here, it may be desirable to define as many properties as possible to verify the design as much as possible.

Abstraction techniques may be applied to the model to reduce the size of the model (block 106). For example, induction may be applied to a table to establish that if a property is verified against a subset of the table then that property necessarily is verified against the entire table. In this way, the number of operations required during the model checking stage maybe substantially reduced because model checking may be performed on the subset of the table rather than the entire table.

Examples of design aspects that may be reduced through the use of abstraction may include, for example, the size of tables, the number of entries in a table, the length of an address, the number of ports. It should be appreciated that abstraction is not limited to these examples and may be applied to many different aspects of a design.

The reduced model may be generated, for example, by recoding the RTL design using a tool such as ePERL or VPP.

Model checking is performed on the reduced model (block 108). Model checking may involve, for example, performing a state transversal to verify the design. Typically, the various properties are run at different times with different iterations in sequence to test various aspects of the design.

If the design does not satisfy a property, the model checker may generate a trace. The trace may be analyzed to determine why the design does not satisfy the property.

An example of a model checker is Cadence symbolic model verifier ("SMV"). Conventional model checkers may utilize binary decision diagrams ("BDD") and/or satisfiability solvers ("SAT").

Through the use of the reduced model, it may be possible to find bugs more quickly as compared to conventional processes. In some cases, it may be advantageous to use these techniques to simply find bugs more quickly during the design process rather than attempt to completely verify the design.

As represented by block 110, the results of the model checking may then be applied to the design. For example, once a bug is found, the corresponding error in the design may be modified. The verification process may then be performed again.

Additional processes may be performed to improve the verification of the design. As represented by block 112, performance analysis may be performed to determine, for example, performance margins in the design. As represented by block 114, sequential operations may be verified. Blocks 112 and 114 will be discussed in more detail in conjunction with FIGS. 2 and 3, respectively.

Figure 2:
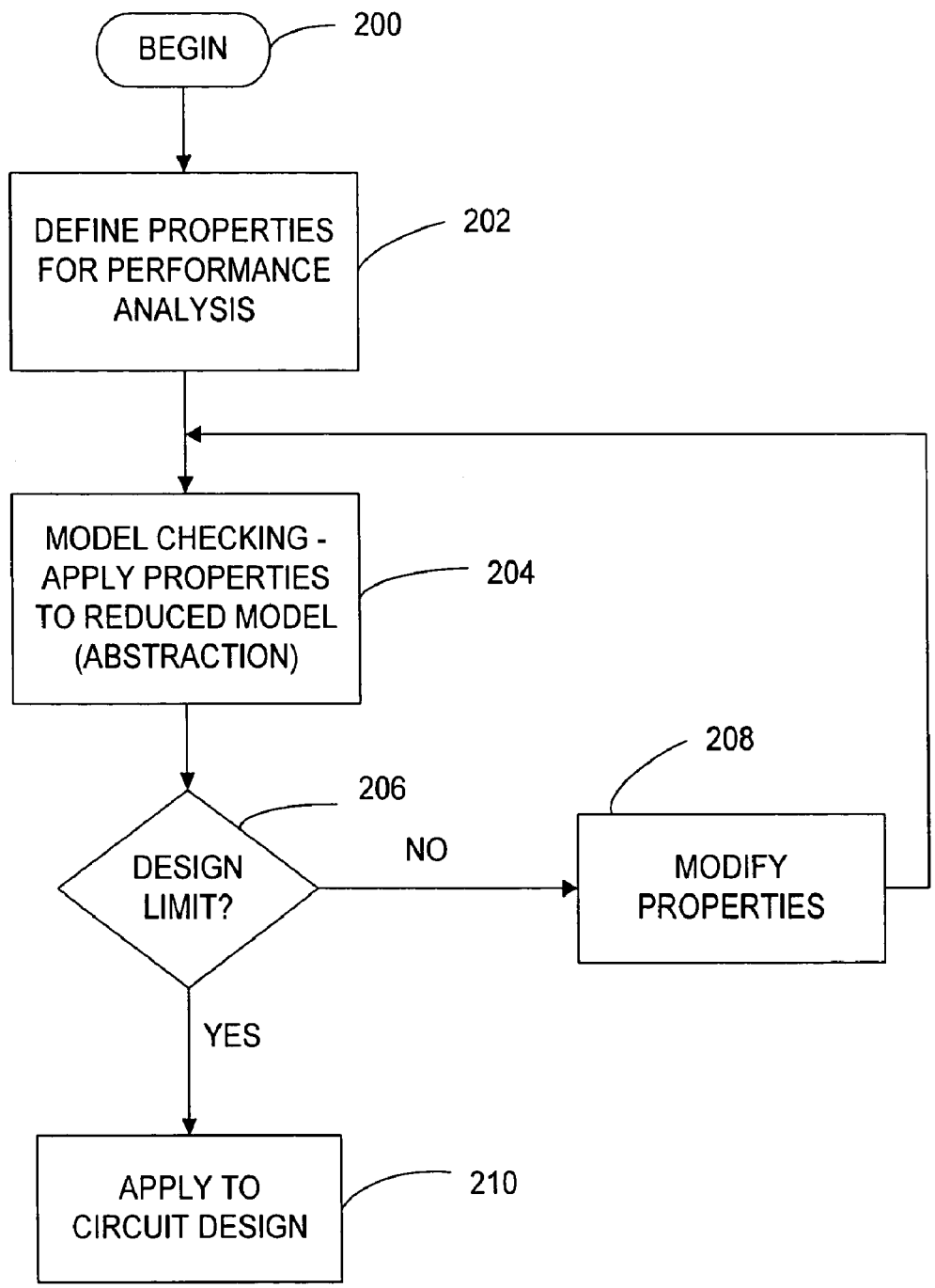
FIG. 2 is a flow chart of one example of performance analysis operations that may be performed in accordance with the invention.

FIG. 2 is a flowchart that represents one embodiment of performance analysis operations that may be performed in accordance with the invention. Performance analysis may involve, for example, determining a worst case condition for an operation. Thus, performance analysis may be used to determine the maximum number of clock cycles within which a given operation must be completed. Such an analysis may be critical in a design where proper operation of a subsequent operation depends on a preceding operation being completed before the subsequent operation begins.

As represented by block 202, one or more properties are defined for the performance analysis. For example, a property may be designed so that a specified number of cycles occurs before a given operation completes.

Next, the properties are applied to the reduced model (block 204). This may be accomplished, for example, using a model checker.

As represented by block 206 the model checker will generate a result that indicates whether the design satisfies the property. For example, this result may indicate whether the design is operating within a design limit.

If the design limit (e.g., a worst case condition) has not been reached, the properties may be modified to further test the limits of the design (block 208). For example, in the example referred to in conjunction with block 202, the number of clock cycles within which the operation completes may be increased. After the property has been modified, the properties are again applied to the reduced model (block 204) to determine whether a design limit has been reached.

If, at block 206 a design limit has been reached, the model checker will generate a trace that may be analyzed to determine where the design limit was reached. This information may be used, for example, to define a performance margin of one or more aspects of the design.

Moreover, the trace may be used to determine the exact conditions (e.g., states of registers and variables, specific operations that were performed, etc.) under which the design limit is met. This information may be useful in redesigning the circuit to improve its performance.

As represented by block 210, these results may then be applied to the design. For example, the design may be modified if the performance margin needs to be increased.

From the above, it should be appreciated that performance analysis may be performed more efficiently when the performance analysis is applied to the reduced model. When the reduced model is properly selected as discussed herein, the results obtained for the reduced model may be applied to the full design.

Figure 3:
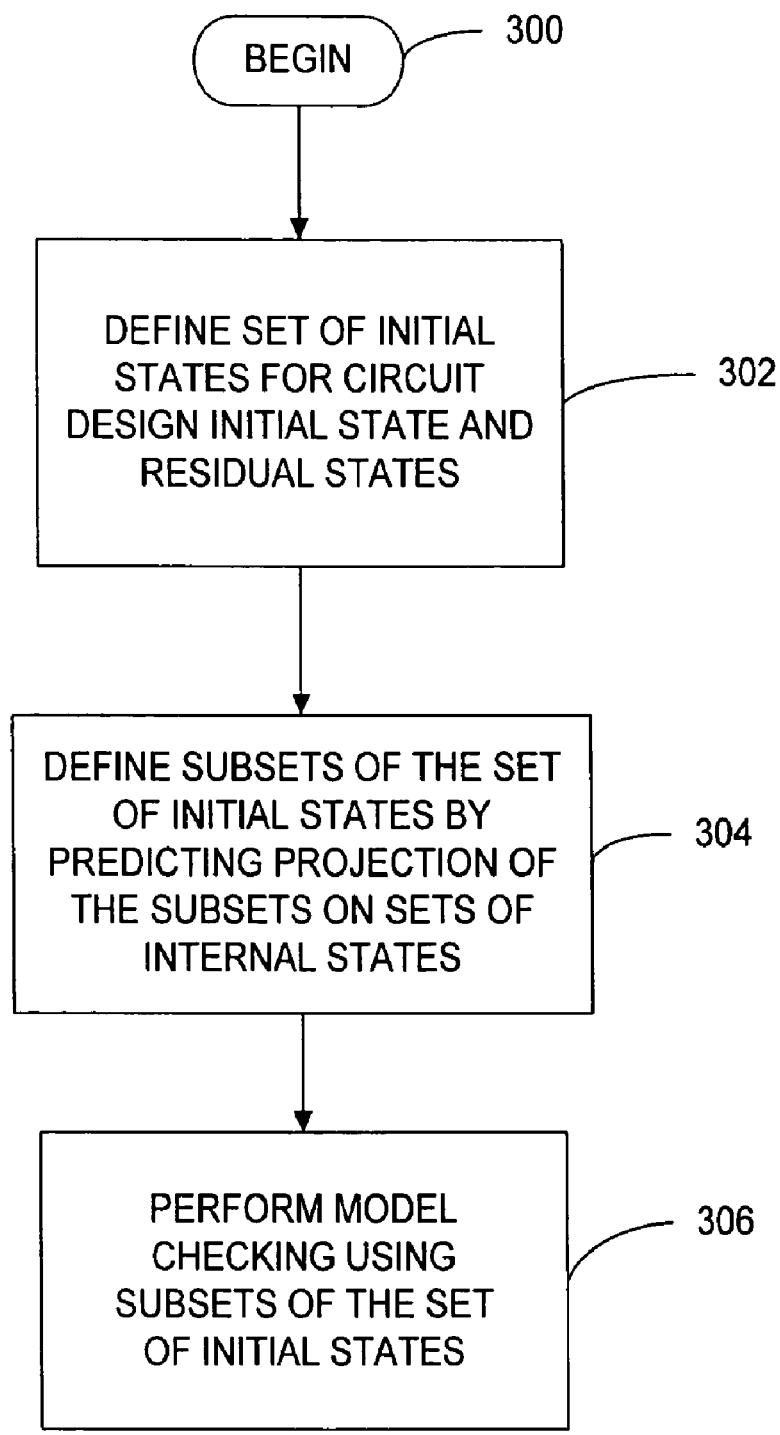
FIG. 3 is a flow chart of one example of sequential operation analysis that may be performed in accordance with the invention.

FIG. 3 is a flowchart that represents one embodiment of sequential operation verification that may be performed in accordance with the invention. As discussed above, in some embodiments a model may be designed such that it does not take sequential operations into account. The operations described in FIG. 3 may be used, for example, to improve the verification provided by such a model.

One problem that may arise when verifying sequential operations is that the initial state of the operation may not be readily determinable for a subsequent operation. This problem may arise when the prior operation is not designed to set all the states used in the process to one or more predefined states. Accordingly, to effectively test such sequential operations, it is desirable to model the potential residual states that may result after a prior operation. In this way the operation of the subsequent operation may be verified more effectively.

It may be established using induction that the properties of the initial states of the design may be defined as a superset of the initial states. This superset may then be applicated to a matrix representative of the design to verify the desired properties. Accordingly, as represented by block 302, a set of initial states (e.g., internal states of the design such as the values of registers and variables) is defined for a sequential operation. This includes defining the known initial states (e.g., a reset state) and the residual states (e.g., states that exist after logic operations tend to "settle down") that may result from a prior operation.

As represented by block 304, the superset of initial conditions is defined by a series of subsets of the superset. In some embodiments, instead of exhaustively searching for the exact superset, a prediction may be made as to the projection of the subsets on sets of internal states (e.g., residual states). These internal states may, for example, relate to the states of registers.

As represented by block 306, properties designed to check the subsequent operations may then be applied to the design (e.g., using a model checker). These properties may be verified using the subsets of initial states that were determined as discussed above.

Referring now to FIGS. 4-7, an example is presented of the application of the above techniques to verify a Gigabit Ethernet switch. This example first involves, in conjunction with FIG. 4, describing the functionality and micro-architecture of the design. Then, specific features and intuitive observations that affect verification decisions are identified. Next, basic abstraction techniques are defined. Experimental results are then outlined by introducing two metrics to analyze bug quality in conjunction with FIGS. 5 and 6. Examples of how the model checking capability may be extended including performance analysis (FIG. 7) are presented. Finally, conclusions that may be made based on the above are discussed.

Figure 4:
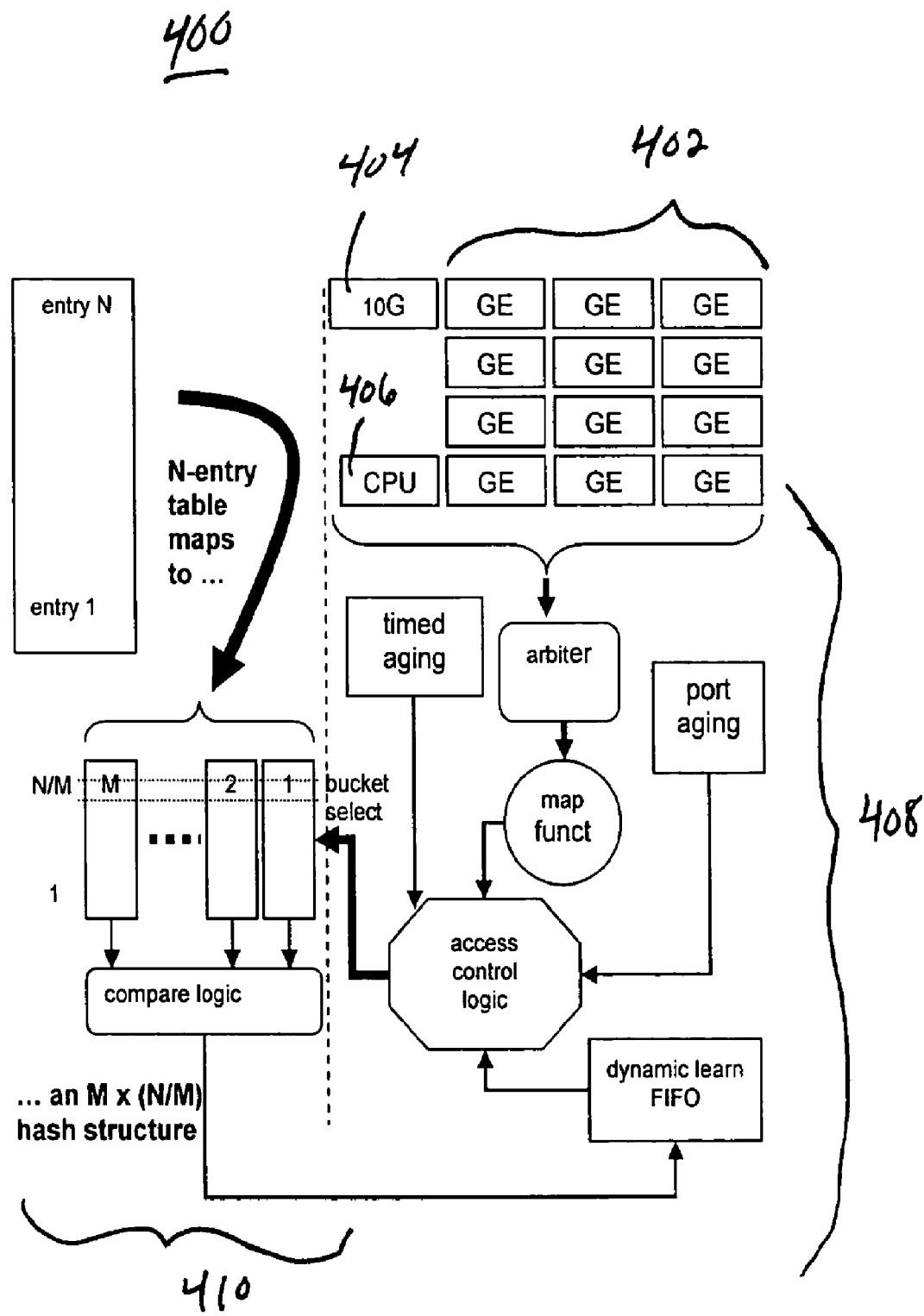
FIG. 4 is a simplified block diagram of one embodiment of a circuit architecture.

FIG. 4 depicts one embodiment of a Gigabit Ethernet switch 400 that includes a single chip with 12 Gigabit Ethernet ("GE") ports 402, one 10-Gigabit high-speed interconnect ("10G") 404 and a CPU interface 406. The switch 400 accomplishes switching functions such as Ethernet switching (Layer 2, or L2), IP switching (Layer 3, or L3) and higher level switching in an Address Resolution Logic ("ARL") block, a portion of which is designated as block 408 in FIG. 4.

At the architectural level, each port (e.g., a port associated with a GE 402 or 10G 404) sends a request to the ARL when that port receives a packet. The ARL logic returns an egress port based on the L2 or L3 destination address. Both L2 and L3 functions use hash tables, referred to as the L2 table and the L3 table, respectively. An example of verification of the L2 table follows.

The L2 table maps MAC addresses to ports. Packets from Gigabit ports are forwarded to the appropriate egress port based on their destination MAC addresses. Switching information, in the form of a MAC address mapped to a port, is both learned and updated dynamically in hardware. The 10G port is an interconnect. The CPU modifies the table by inserting or deleting entries, which may be exempt from dynamic updates. Entries are dynamically "aged" out of the table based either on usage over time, or upon request by the CPU.

For each packet, there are at most three possible actions that the ARL performs: source MAC address lookup, destination MAC address lookup, and dynamic learning. If the chip is running at 125 MHz, the L2 table logic should finish these actions within 84 cycles for each Gigabit port and within 8 cycles for the 10-Gigabit port.

The L2 table is structured as a hash table 410 as depicted in FIG. 1. The 16K logical entries are mapped to 2K buckets, with 8 entries per bucket, using a hash function. There is no ordering between the buckets. Similarly, within each bucket, there is no ordering among the entries. Duplicate entries within a bucket are strictly forbidden. Dynamic modifications are read-modify-write operations which require coherency. The reads and writes are decoupled. Aging has lower priority than lookups, so the design accounts for starvation cases.

The L2 table logic has traditionally been difficult to verify due to its dynamic nature. First, there may be no high level learning specification. Learns may be cancelled for many reasons. Without knowing the exact state of the logic on a cycle-accurate basis, it may be almost impossible to predict when learns happen. Aging and CPU operations also contribute dynamic activity, resulting in corner cases that are difficult to stimulate using traditional simulation techniques.

Second, performance issues may be difficult to identify in simulation. The design must handle multiple processes concurrently, fairly, and efficiently to meet throughput and latency considerations. Multiple operations associated with a single packet may be decoupled over many cycles. Erroneous behavior may thus result in an observable effect thousands of cycles after the fact, or not at all, depending on the test or application. This makes verifying performance in simulation difficult.

Third, writing a checker for this block may not be appropriate. Due to its dynamic nature, the checker may be easily written similarly to the RTL. However, it is then difficult to guarantee the checker's correctness given the similarity of the checker and the RTL.

Accordingly, for a design such as this, the teachings provided herein may provide more effective verification as compared to traditional simulation techniques.

To discover design errors efficiently, two verification decisions may be made for this example. First, in the case where there is no complete specification available, it may be desirable to define as many properties as possible. In this example, each property verifies a different RTL function.

As discussed above, properties may be defined to verify various aspects of a design. For example, to test the operation of a stack bit in the L2 table, one property may involve verifying that when the valid bit=0 and the learn operation is in progress, the stack bit should not be set. Another property may verify that if there is no current CPU operation, the stack bit should not be set.

Second, abstraction may be applied to reduce the design size. In this example, the L2 table logic includes approximately 3000 registers and a 16K-entry (1 mbit) lookup table. It may be impracticable to verify a large design with complicated properties such as this with state-of-the-art model checkers. Thus, there may be advantages in applying aggressive abstraction even though this may result in some important features not being completely verified.

Assume that a Kripke structure $M=(S, I, R, L, h)$ models the L2 table logic where S is the set of states, $I \subseteq S$ is the set of initial states, $R \subseteq S \times S$ represents the transition relation, L is the set of labels on S and h: $N^{48} \rightarrow N^{11}$ is the surjection where $N^i = [1 \ldots 2^i]$. In other words, h is a hash function that maps MAC addresses to indices of the L2 table. Also assume that L does not include the labels related to the hash function. Finally, let $M \downarrow t$ be a short-hand notation for the model M where a function t is disabled. For example, $M \downarrow$ aging represents the reduced L2 table model where aging is disabled.

Lemma 1 Let i and j be two indices to the hash table, i.e., there are two MAC addresses a and b where $h(a)=i$ and $h(b)=j$. Assume that $M' \downarrow$ aging is the modified L2 table model by swapping two entries indexed by i and j separately. Then $M \downarrow$ aging is bisimilar to $M' \downarrow$ aging.

Lemma 1 implies that the buckets in the L2 table are fully symmetric when aging is disabled. Thus, instead of modeling all 2048 buckets, it may only be necessary to model two buckets. Here, the buckets are independent, yet effectively identical. Thus, the operation of one bucket is the same as the operation of another bucket.

With aging enabled, the reduced L2 table is used because the original table may be too large for practical verification. Thus, the aging behavior may be modified to match the reduced table. This may, however, introduce both false positive and false negative behaviors into the abstracted model. Such unwanted behaviors may be avoided by proper analysis of the design and debugging.

Similar symmetry may also exist within buckets. For example, any two entries within a bucket may be symmetric. Thus, it may be possible to only model two entries per bucket, rather than eight entries per bucket.

In addition to reducing the table size, two more abstractions may be applied to further reduce the complexity of the reduced model. First, the MAC addresses may be represented by two bits instead of 48 bits because there are only four entries in the reduced L2 table. This is a known technique in formal verification. Second, the behaviors of the 12 Gigabit ports may be independent even though they may not be symmetric. This lack of symmetry may, for example, be a result of arbitration whereby one port is assigned a higher priority than another port.

Lemma 2 Let $M \downarrow port^i$ denote the L2 table model without sending requests from port i and p be an ACTL property on $M \downarrow port^i$, then $$M \downarrow port^i \not\models p \rightarrow M \not\models p.$$

According to Lemma 2, if a universal property on the reduced model $M \downarrow port^i$ is disproved, that property will be false in the original model M. Hence, the reduced model may incorporate at most two Gigabit ports instead of twelve. Here, the 10-Gigabit port and the CPU interface are modeled accurately. By applying these abstractions, the size of the L2 table model may be reduced to fewer than 150 registers. See Table 1.

TABLE 1

|  | Original Model | Abstract Model |
| --- | --- | --- |
| #registers | 2878 | <150 |
| #buckets | 2048 | 2 |
| #entries/bucket | 8 | 2 |
| #bits/mac addr | 48 | 2 |
| #Gig ports | 12 | 2 |

In addition to abstractions, the environment model also may be simplified. A request from a Gigabit port to the L2 table arrives every 84 cycles. It may be difficult for SMV to complete a fix-point computation if every port request is modeled precisely. In some applications, a single request from multiple ports may be more interesting from a design verification point of view than multiple requests from a single port. Therefore, only one request per port may be modeled, significantly reducing the verification computation time.

These abstractions may be accomplished by recoding the RTL using ePerl. The rewritten code may be configurable. For example, to verify the logic with one Gigabit port, one 10-Gigabit port, and aging, ePerl may be used to generate, the model and its related properties automatically. If a property is falsified by SMV, the tool may generate a counterexample that explains why that property is false.

The number of properties defined to verify a design depends, in general, on the complexity of the design. In some applications, the number of properties may be between 150 and 300 properties. A typical runtime for every property may range, for example, from 15 seconds to 2 hours. To verify 35 different configurations and where all design changes are regressed against these 35 configurations it may take, for example, eight person months to complete the formal verification process.

Verification as discussed herein may be more efficient than conventional simulation techniques. For example, a simulator may observe signals at the interface of the ARL block. Hence, it not only should stimulate the error behavior in the L2 table logic, it also should make them visible at the ARL interface. This reduces the effectiveness of the simulator.

To quantify the quality of bugs discovered, two metrics may be defined: error stimulus and error visibility.

The first metric, error stimulus function ("ES") is the probability of the input stimuli required to discover the bug starting with the initial states. For example, assume that a valid MAC address A is stored in a particular bucket of the L2 table.

ES for a lookup of MAC address B with h(B)=h(A) is 1/2048. The lower the value ES is, the less likely that the bug can be exercised by random simulation. In computing ES, only the best possible known case may be considered to stimulate the corresponding bug. This provides a conservative approximation of ES.

The error visibility ("EV") of a bug is a function of time and input stimuli. $EV_{time}$ is the number of cycles required for erroneous behavior to propagate to the test bench. $EV_{stim}$ measures the probability of the input stimuli required to propagate the bug from cause to externally visible symptom. Then $EV=EV_{stim}/EV_{time}$ provides a means of comparing the relative visibility of bugs. $EV_{stim}$ is calculated similarly as ES, based on a conservative approximation. As an example, assume that the minimum number of cycles to propagate a bug to the ARL interface is 84 cycles. Also assume that the required stimuli include a sequence of events:

Two consecutive 10Gigabit port lookup requests on bucket i,

A specific Gigabit port lookup request also on bucket i, then $$EV_{stim}=(1/13)^2*1/2048*1/13*1/2048=2.5e-7$$

and $$EV=EV_{stim}/EV_{time}=3.0e-9.$$

Thus EV is evaluated conservatively because $EV_{time}$ is approximated using the shortest trace and $EV_{stim}$ is the upperbound probability for stimuli required to propagate the bug.

Figure 5:
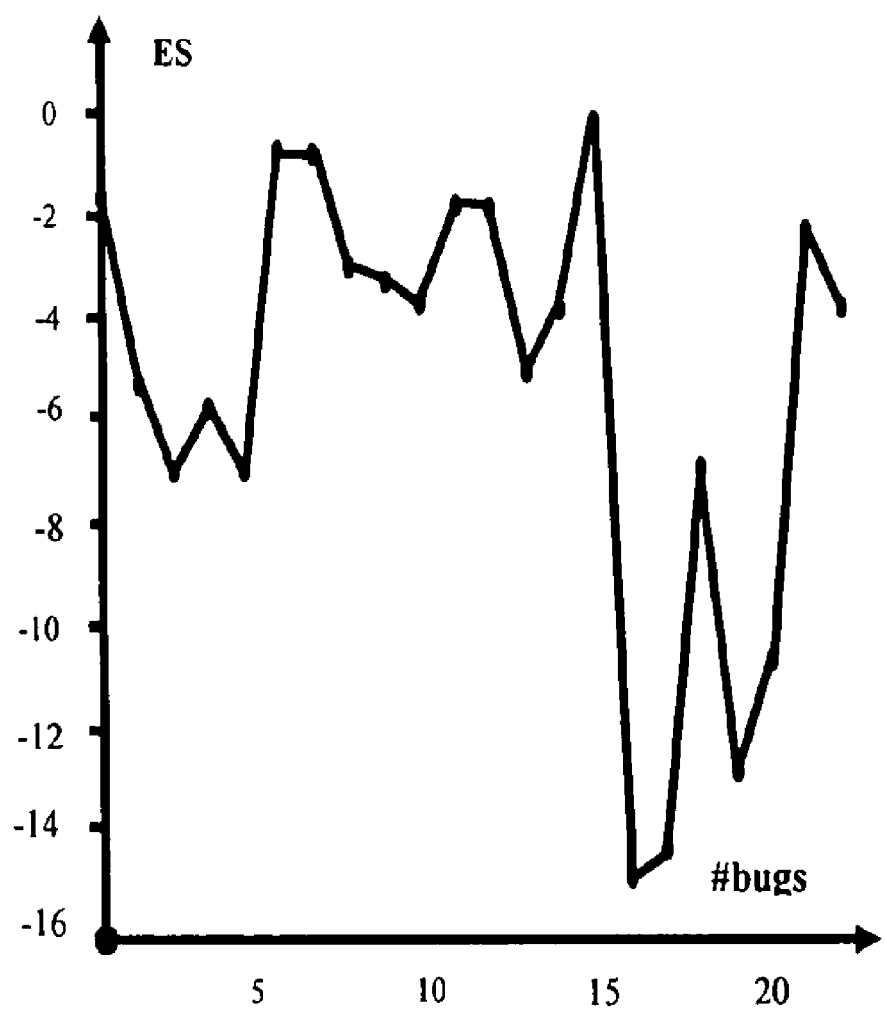
FIG. 5 is a graph of an example of error stimulus in accordance with the invention.
Figure 6:
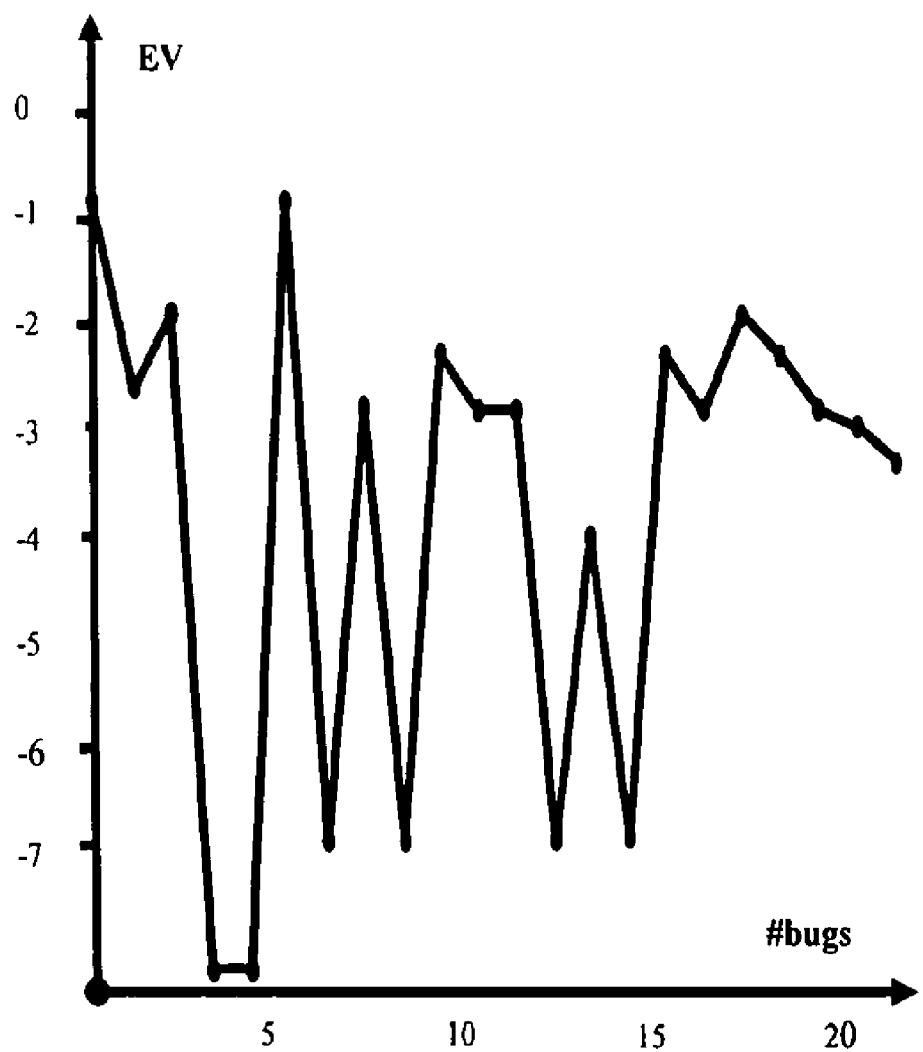
FIG. 6 is a graph of an example of error visibility in accordance with the invention.
Figure 7:
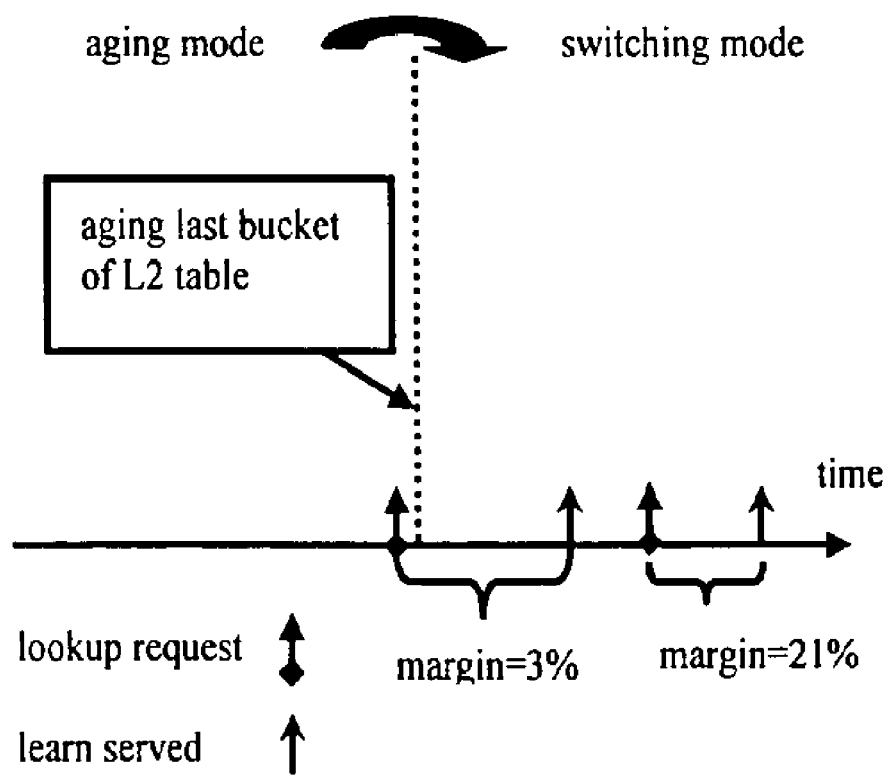
FIG. 7 is a simplified representation of performance analysis in accordance with the invention.

Two examples of the error stimulus ES and error visibility EV are depicted in FIGS. 5 and 6. In both figures, the X axis corresponds to the cumulative number of bugs and the Y axis corresponds to ES and EV separately. The Y axis is in logarithm scale. For example, in FIG. 6, −6 means that $EV=10^{-6}$. In both figures, the lower the value, the less likely that the bug may be found by a simulator. FIG. 5 depicts that it is much more difficult to stimulate bug No. 16 than bug No. 15. It may be relatively easy for a simulator to detect bug No. 15. In contrast, without formal approaches, it may be extremely difficult for random simulation to detect bug No. 16. In FIG. 6, the EVs for bug No. 4 and No. 5 are not computed because they have not been propagated to the ARL interface directly. However, these bugs would degrade the system performance. Accumulated inefficiencies eventually lead to a visible error. The required number of simulation cycles to detect such bugs may be prohibitively large. Accordingly, bugs that have lower ES or EV are defined as "high quality" bugs.

When aggressive abstraction is used, certain important performance issues may not be addressed. For example, in the above example all Gigabit port lookup requests and learns should be served within 84 cycles. An initial analysis may establish that the design has, for example, 47% and 21% margin for lookups and learns, respectively.

Given the abstracted model, these performance requirements may not have been completely verified. However, in an abstracted configuration, SMV may be used to determine that a learn is served far later than expected when the logic transitions from the aging mode to the normal switching mode. If a lookup request comes just before that transition, it is possible that its learn happens much later. By manual construction of a similar scenario for all ports, performance analysis may be used to determine, for example, that the performance requirement for learns is only marginally satisfied. For example, the margin for learns may actually be 3% rather than 21% (see, for example, FIG. 7).

This may raise potential problems due to the assumptions made in the RTL design. It may be difficult for simulation to detect this trace because it may require, for example, that over twenty different behaviors occur in a specific order and time. In contrast, starting with an SMV trace, an informal analysis may be constructed using performance analysis as described herein to provide verification results that may not be accomplished by either simulation or formal verification independently.

As discussed above, the performance analysis process may involve constructing properties to test the design limits, performing model checking and modifying the properties to determine the actual design limits.

For example, properties may be defined to test the lookup and learn operations. Starting with an SMV trace, an initial informal analysis of the margin may be made. The lookup and learns may then be repeatedly pushed back later in the request cycle (e.g., by modifying the properties) until SMV generates a trace.

In the abstracted model discussed above, only one request from each port was considered. That is, sequential requests were not considered. Thus, the interaction between consecutive requests from the same port may not have been modeled or verified.

Ideally, if a request is served, the related state registers return to the reset values. In reality, this may not always be true because the residual state of the previous request may not be cleared. This may introduce unexpected behavior for subsequent requests. In some embodiments, this problem may be addressed by modeling consecutive requests using a set Q of initial states larger than I, i.e., $I \subset Q$, and Q−I models the set of residual states. The L2 table may already be modeled non-deterministically. Thus, only the initial values for the registers outside the L2 table may need to be considered. This results in the following theorem, Theorem 1 Let M↓req=(S, I, R↓req, L) be the L2 table model with only one request for each port and p be an ACTL property on M↓req. Let $I \subset Q$, $Q \subset S$ and M'↓req=(S, Q, R↓req, L) be a modified Kripke structure using Q as an initial set of states. Then $$M'{\downarrow}req \vDash p \wedge M'{\downarrow}req \vDash AX^{84}Q \Rightarrow M \vDash p$$

where $$AX^{84} = \overline{AX \ldots AX}^{84}.$$

Sketch of Proof: There are at least 84 cycles between every two requests from a Gigabit port. The above theorem is easily proved by reasoning inductively on every 84 cycles per port.

A key to extend the result is to find the reachable set of states Q. This may be a relatively difficult task. Instead of searching for the exact Q, its projection on subsets of registers may be predicted. Assume that V is the set of registers on M↓req. Partitioning V into m equivalence classes: $V_i$, i.e., $$V = \bigcup_i^m V_i$$

and $V_i \cap V_j = \Phi$. Let $Q_i$ denote the projection of Q on $V_i$. Then predict $Q_i$ using the model checker with the requirement that $$M_i'{\downarrow}req=(S, Q_i, R{\downarrow}req, L) \text{ and } M_i'{\downarrow}req \vDash AX^{84}Q_i.$$

If it is not possible to predict $Q_i$, or $Q_i$ is too large, then use the projection of I on $V_i$, denoted as $I_i$. Eventually, $Q'=Q_{ii}\times\ldots\times Q_{ij}\times I_{ki}\times\ldots\times I_{kp}$ may be used as the set of initial states for model checking. It may not always be possible to fully verify the intended property on M with this approximation. However, this extension does increase verification confidence.

From the above it may be appreciated that formal techniques may be used to verify circuits such as a complicated Ethernet switching table. In summary, this process may involve, for example, applying aggressive abstraction to debug the basic logic. The effectiveness of this technique may be demonstrated by a number of "high-quality" RTL bugs. Then, based on classic model checking, the techniques are extended formally and informally to analyze performance. In contrast to ad hoc performance simulation, such rigorous analysis may be beyond the capability of either simulation or formal techniques alone. Next, the classic model checking may be extended using a novel induction to avoid state explosion as the environment model becomes more sophisticated. These techniques may be applied with relatively little difficulty to many table driven designs.

Different embodiments of the invention may be implemented using a variety of hardware and software processing components. In some embodiments of the invention, hardware components such as controllers, state machines and/or logic are used in a system constructed in accordance with the invention. In some embodiment of the invention, code such as software or firmware executing on one or more processing devices may be used to implement one or more of the described operations.

In addition, the teachings herein may be applied to a variety of design problems and are not limited to the embodiments described herein.

In summary, the invention described herein generally relates to an improved verification technique. While certain exemplary embodiments have been described above in detail and shown in the accompanying drawings, it is to be understood that such embodiments are merely illustrative of and not restrictive of the broad invention. In particular, it should be recognized that the teachings of the invention apply to a wide variety of systems and processes. It will thus be recognized that various modifications may be made to the illustrated and other embodiments of the invention described above, without departing from the broad inventive scope thereof. In view of the above it will be understood that the invention is not limited to the particular embodiments or arrangements disclosed, but is rather intended to cover any changes, adaptations or modifications which are within the scope and spirit of the invention as defined by the appended claims.

What is claimed is:

1. A method of verifying a circuit design of a network switching logic block comprising:
    generating, by a processor, a reduced model of the circuit design of the network switching logic block, wherein the generating the reduced model comprises applying induction to define properties of initial states of the circuit design as a superset of the initial states of the circuit design to verify a property against an entire table of the network switching logic block by verifying the property against a subset of the entire table;
    checking the reduced model by applying at least one performance property to the reduced model;
    generating at least one model of a sequential operation of the circuit design, the sequential operation comprising a lookup request on a bucket of the reduced model; and
    applying the at least one model to the reduced model to verify the circuit design,
    wherein the switching logic block includes a plurality of Ethernet ports and MAC addresses mapped to the plurality of Ethernet ports.

2. The method of claim 1 wherein generating the reduced model comprises applying induction to the circuit design.

3. The method of claim 1 wherein generating the reduced model comprises reducing a number of ports.

4. The method of claim 1 wherein generating the reduced model comprises ignoring sequential operations.

5. The method of claim 1 wherein the network switching logic block comprises an Ethernet switch.

6. The method of claim 1 wherein generating the at least one model of the sequential operation comprises modeling potential residual states that may result after a prior operation.

7. The method of claim 1 wherein the generating a reduced model comprises generating the reduced model of the circuit design of the network switching logic block, the network switching logic block including the plurality of Ethernet ports, wherein the reduced model includes only one request per Ethernet port.

8. The method of claim 1 wherein generating the reduced model comprises modeling at least a portion of the network switching logic block as a Kripke structure.

9. The method of claim 1 wherein:
    the circuit design comprises a plurality of buckets; and
    generating the reduced model comprises modeling only two entries per bucket of the circuit design.

10. The method of claim 1 wherein:
    the circuit design comprises a plurality of MAC addresses; and
    generating the reduced model comprises representing the MAC addresses by only two bits.

11. The method of claim 1, further comprising conducting performance analysis on the reduced model by measuring error stimulus and error visibility.

12. The method of claim 11 further comprising inputting at least one error stimulus the reduced model.

13. The method of claim 11 wherein inputting the at least one error stimulus comprises generating two consecutive port lookup requests on a bucket.

14. The method of claim 11 wherein inputting the at least one error stimulus comprises:
    generating two consecutive ten Gigabit port lookup requests on a bucket of the circuit design; and
    generating a specific Gigabit port lookup request on the bucket.

15. An apparatus comprising:
    a processor, the processor being configured to:
    generate a reduced model of a circuit design of a network switching logic block, wherein the generating the reduced model comprises applying induction to define properties of initial states of the circuit design as a superset of the initial states of the circuit design to verify a property against an entire table of the network switching logic block by verifying the property against a subset of the entire table;
    check the reduced model by applying at least one performance property to the reduced model;
    generate at least one model of a sequential operation of the circuit design, the sequential operation comprising a lookup request on a bucket of the reduced model; and
    apply the at least one model to the reduced model to verify the circuit design, wherein the switching logic block includes a plurality of Ethernet ports and MAC addresses mapped to the plurality of Ethernet ports.

16. The apparatus of claim 15, wherein the processor is further configured to conduct performance analysis on the reduced model by measuring error stimulus and error visibility.

17. A computer-readable storage device having instructions stored thereon which, when executed by a computer system, cause the computer system to:
generate a reduced model of a circuit design of a network switching logic block, wherein the generating the reduced model comprises applying induction to define properties of initial states of the circuit design as a superset of the initial states of the circuit design to verify a property against an entire table of the network switching logic block by verifying the property against a subset of the entire table;
check the reduced model by applying at least one performance property to the reduced model;
generate at least one model of a sequential operation of the circuit design, the sequential operation comprising a lookup request on a bucket of the reduced model; and
apply the at least one model to the reduced model to verify the circuit design,
wherein the switching logic block includes a plurality of Ethernet ports and MAC addresses mapped to the plurality of Ethernet ports.

* * * * *